United States Patent [19]

Heymann et al.

[11] 4,253,875
[45] Mar. 3, 1981

[54] CATALYTIC LACQUER FOR PRODUCING PRINTING CIRCUITS

[75] Inventors: Kurt Heymann; Rolf Rolff, both of Berlin, Fed. Rep. of Germany

[73] Assignee: Schering Aktiengesellschaft, Berlin and Bergkamen, Fed. Rep. of Germany

[21] Appl. No.: 957,327

[22] Filed: Nov. 3, 1978

Related U.S. Application Data

[63] Continuation of Ser. No. 821,301, Aug. 1, 1977, abandoned.

[30] Foreign Application Priority Data

Aug. 4, 1976 [DE] Fed. Rep. of Germany ....... 2635457

[51] Int. Cl.³ ............................. C23C 3/02; C09D 5/24
[52] U.S. Cl. ..................................... 106/1.26; 106/1.27; 106/1.28; 260/29.3; 260/29.6 M; 260/29.6 MM
[58] Field of Search .................... 106/1.26, 1.27, 1.28; 260/29.6 M, 29.6 BM, 29.6 MM, 29.2 EP, 29.3

[56] References Cited

U.S. PATENT DOCUMENTS

| | | | |
|---|---|---|---|
| 3,361,580 | 1/1968 | Schneble et al. | 106/1 |
| 3,372,059 | 3/1968 | Roth | 117/227 |
| 3,454,416 | 7/1969 | Heymann et al. | 117/47 |
| 3,607,317 | 9/1971 | Schneble | 106/1 |
| 3,915,717 | 10/1975 | Feldstein et al. | 106/1 |
| 3,930,072 | 12/1975 | Wilks | 427/306 |
| 4,001,470 | 1/1977 | Schulze-Berge | 427/304 |
| 4,002,786 | 1/1977 | Hirohata et al. | 427/430 |

*Primary Examiner*—Earl A. Nielsen
*Attorney, Agent, or Firm*—Michael J. Striker

[57] ABSTRACT

A catalytic lacquer for the production of printed circuit boards using basic materials and metal deposition methods. The lacquer has the following composition: a binding agent based on synthetic or natural materials; water; a metal salt; a complex former; and a reducing agent. The binding agent may be a water soluble or dispersable compound. The metal salt may be a water soluble palladium, copper, silver, gold or nickel salt, preferably the sulphate. The complex former may be in the form of a compound forming stable complexes with metal ions. The reducing agent may be in the form of formaldehyde, hydrazine or its derivatives, boron compounds, sorbitols, phosphites, or hydrophosphites. The lacquer may also include an organic solvent or solvent mixture, preferably methylene chloride. A filler and stabilizer may also be included in the composition of the lacquer. The lacquer may be applied to base materials by means of silk screen printing, and then dried so that the metal seed layer is strengthened by the action of a metal deposition reduction bath.

6 Claims, No Drawings

CATALYTIC LACQUER FOR PRODUCING PRINTING CIRCUITS

This is a continuation of application Ser. No. 821,301, filed Aug. 1, 1977, now abandoned.

BACKGROUND OF THE INVENTION

The present invention relates to a catalytic lacquer for producing printed circuits using basic materials and metal depositing methods.

There is a large number of methods for producing printed circuits. Wide use is made of the so-called subtractive method by which one-side printed circuits and two-side printed boards with through-contact hole connections are produced.

The subtractive method uses one-side or two-side coated carrier material which is subjected to a negative printing method (silkscreen or photo printing). With the through-contact method, the hole walls are occupied by palladium nuclei on which by chemical copper coating, conducting connection of top and bottom side is brought about. The thin copper layer deposited on the hole walls had to be strengthened by a galvanizing process with very ductile copper coatings. Of course, the galvanic copper is deposited not only in the hole walls, but also on the conductor paths. For the subsequent etching process, the printed lines must be covered galvanically with an etch resisting material, e.g., tin-lead or tin.

Prior to the etching of the board, the silkscreen lacquer is removed and the free copper surfaces are etched with etching solution. On the average, depending on the conductive pattern, 60 to 70% of the copper is etched off.

The incidence of such etching solutions containing large amounts of copper is very large and in all cases presents an expensive discharge and pollution problem.

In the majority of procedural steps, the relatively expensive basic material and the underetching of the conductor lines have led to the abandoning of copper coated material and the introduction of a new method.

With the additive method, an adhesive is placed on the plates (German Pat. No. 14 96 984). This adhesive, to ensure adequate adhesion, is chemically pickled, mainly with chrome sulphuric acid (German Laid Open Document No. 16 65 314). Then such a plate is activated in the conventional manner and chemically copper-coated up to 4-5$\mu$, enclosing possibly required holes. Then, by silkscreen or photo printing, a negative of the desired circuit board is printed and the desired conductive pattern of, e.g. 30$\mu$ thickness is applied by galvanic copper coating.

The following last steps are the same as with the subtractive method described earlier.

The additive method makes possible the production of much finer conductive patterns since the edging process need only remove the 4-5$\mu$ chemical copper layer; but this still requires many steps. Also, a plate coated with adhesive must be used which must be first roughened to make the coats to be applied to adhere better.

It is, therefore, an object of the present invention to provide an arrangement making possible the production of printed circuits with fewer steps than the previously known methods.

Another object the present invention is to provide an arrangement of the foregoing character which may be economically fabricated and has stable characteristics while in service.

A further object of the present invention is to provide an arrangement, as described, which has a substantially long service life.

SUMMARY OF THE INVENTION

The objects of the present invention are achieved by providing a catalytic lacquer which comprises:

(a) a binding agent based on synthetic or natural materials
(b) water
(c) a metal salt
(d) a complex former and
(e) a reduction agent.

The catalytic lacquer of the present invention comprises a binding agent, water, a metal salt, a complex former and a reducing agent, and may also contain an organic solvent or solvent mixture, a filler or thickening agent, a stabilizer and, possibly, a wetting agent.

As binding agent one may use water soluble or dispersable agents, particularly based on synthetic and natural materials, for example, acryl compounds, polyvinyl compounds, expoxy compounds, phenolic resin compounds, cellulose and its derivatives, particularly methyl and carboxy methyl cellulose, guar, gelatin, zeins and alginates.

As metal salts one may use mainly water soluble palladium, copper, silver, gold or nickel salts, particularly the sulphates.

As complex formers one may use those forming stable complexes with the metal ions and which, during drying of the lacquer in accordance with the invention are decomposed under the influence of the reducing agent, forming metal nuclei. Among these are ethylene diamine tetraacetic acid and its derivatives, and organic acids, for example, tartaric acid and citric acid.

As reducing agent one may use: formaldehyde, hydrazine and its derivatives, boron compounds, sorbitols, phosphites, hypophosphites and others which must satisfy the condition that metal salts contained in the lacquer in accordance with the invention reduce the metal only during the drying process.

The lacquer in accordance with the present invention may also contain organic solvents, e.g., methylene chloride, stabilizer such as sulphur- or selenium containing compounds, fillers with thixotropic properties, e.g., colloidal silica, bentonite, chalk or titanium dioxide.

The lacquer in accordance with the present invention makes it possible with fewer steps than previously known to produce a conductive coat, where after applying the lacquer, preferably by means of silk screening, and the drying of this lacquer, the metal nucleus layer can be strengthened by the action of a metal depositing bath.

A particular technical advantage is that the otherwise required seeding with palladium and pickling are not required. Also, the use of an adhesive agent is no longer necessary.

The metal nucleus (seed) layer when using the lacquer deparates (strips) extremely finely and uniformly; thus extremely thin layer thicknesses of, for example, only 0.067 $\mu$m can be produced with excellent adhesion.

For the application of the lacquer on the basic materials, the usual printing methods can be used, where a desired conductive pattern can be placed on a base by the positive printing method. A silkscreen method is preferred. As base plates, one may use those based on synthetics, for example, phenol, resin paper, epoxy glass, flexible thermoplastic and ceramic material.

The drying of the applied lacquer may proceed through longtime drying at room temperature (20° C.) or by heating to 400° C.

Here the conventional devices, for example, hot air furnaces and irradiation lamps may be used.

To strengthen the metal seed layer with a layer thickness of about 0.03 μm, a conventional metal depositing reduction bath can be used, which allows the layer thickness to be built up to 50 μm.

The quantitative basic composition of this lacquer is as follows:

| | |
|---|---|
| (a) binding agent | 3 to 20 g |
| (b) water | 30 to 90 g |
| (c) metal salt | 3 to 20 g |
| (d) complex former | 4 to 25 g |
| (e) reducing agent | 1 to 10 g |
| (f) organic solvent | 0 to 10 g |
| (g) filler material | 0 to 5 g |
| (h) stabilizer | 0 to 1 g |
| (i) wetting agent | 0 to 1 g |

In the following, the manufacture and application of the lacquer in accordance with the invenetion is described in detail.

EXAMPLE 1

| Composition of lacquer: | |
|---|---|
| carboxymethyl cellulose | 3 g |
| colloidal silica | 0.5 g |
| water | 63.4 g |
| copper sulphate | 10 g |
| ethylen diamine tetraacetic acid | 13 g |
| formaldehyde (37% by weight) | 10 g |
| stabilizer (rhodanine) | 0.1 mg |

By means of NaOH solution, the pH value is raised to 12.8.

The catalytic lacquer is filled into a silkscreen printing machine and printed through the pattern in the screen on a plastic plate. Then it is baked for 7 minutes at 200°. The copper ions are reduced to copper and simultaneously a bonded connection between lacquer and plastic surface is produced. The plate so treated is immersed in a chemical copper bath and the copper layer thickness is raised to 30 to 50 μm. Finally, the plate is rinsed and dried. Now it can be equipped with components.

EXAMPLE 2

| Composition of lacquer: | |
|---|---|
| methyl cellulose | 2 g |
| quar | 1 g |
| aerosil | 0.5 g |
| water | 58.4 g |
| copper sulphate | 10 g |
| ethylene diamine tetraacetic acid | 13 g |
| formaldehyde (37% by weight) | 10 g |
| stabilizer (Rhodanin) | 0.1 mg |
| methylene chloride | 5 g |

By means of NaOH solution, the pH value is raised to 12.8.

This lacquer is applied as described with Example 1.

EXAMPLE 3

| Composition of lacquer: | |
|---|---|
| starch | 5 g |
| acrylate emulsion | 20 g |
| aerosil | 0.5 g |
| water | 41.3 g |
| copper sulphate | 10 g |
| ethylene diamine tetraacetic acid | 13 g |
| formaldehyde | 10 g |
| stabilizer (rhodanin) | 0.1 mg |
| wetting agent (laurylether sulphate) | 0.1 mg |

The pH value is raised to 12.5 by means of a 30% NaOH solution.

The application of this lacquer is the same as described for Example 1.

Without further analysis, the foregoing will so fully reveal the gist of the present invention that others can, by applying current knowledge, readily adapt it for various applications without omitting features that, from the standpoint of prior art, farily constitute essential characteristics of the generic or specific aspects of this invention, and therefore, such adaptations should and are intended to be comprehended within the meaning and range of equivalence of the following claims.

What is claimed is:

1. Catalytic lacquer for the production of printed circuit boards using basic materials and metal deposition methods having a composition of:
    (a) a binding agent comprising water soluble or dispersable compounds selected from the group consisting of acrylic resins, phenolic resins, methyl and carboxymethyl cellulose, guar, gelatin, zeins and alginates;
    (b) water;
    (c) a metal salt selected from the group consisting of water soluble palladium, copper, silver, gold and nickel salts;
    (d) a complex former for said metal; and
    (e) a reducing agent.

2. The catalytic lacquer as defined in claim 1 wherein said complex former comprises a compound forming stable complexes with metal ions selected from the group consisting of ethylene diamine tetraacetic acid, its derivatives, tartaric acid and citric acid.

3. The catalytic lacquer as defined in claim 1 wherein said reducing agent is selected from the group consisting of formaldehyde, hydrazine, its derivatives, boron compounds, sorbitols, phosphites and hydrophosphites.

4. The catalytic lacquer as defined in claim 1 including an organic solvent or solvent mixture.

5. The catalytic lacquer as defined in claim 1 including a filler selected from the group consisting of colloidal silica, bentonite, chalk, barium sulfate and titanium oxide.

6. The catalytic lacquer as defined in claim 1 including a stabilizer selected from the group consisting of sulphur compounds and selenium compounds.

* * * * *